(12) United States Patent
Allen et al.

(10) Patent No.: US 6,897,888 B2
(45) Date of Patent: May 24, 2005

(54) SCANNING BRUSH AND METHOD OF USE

(75) Inventors: Paul C. Allen, Beaverton, OR (US); Michael J. Bohan, Beaverton, OR (US); Morris H. Green, Milwaukie, OR (US); Henry Christopher Hamaker, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/787,569

(22) Filed: Feb. 25, 2004

(65) Prior Publication Data

US 2004/0165056 A1 Aug. 26, 2004

Related U.S. Application Data

(62) Division of application No. 09/273,115, filed on Mar. 19, 1999, now Pat. No. 6,731,320.

(51) Int. Cl.[7] .......................... B41J 15/14; G02B 26/08
(52) U.S. Cl. ...................... 347/233; 347/256; 347/239; 359/204; 359/197
(58) Field of Search ................................ 347/233, 241, 347/256, 225, 239, 255; 359/197, 205, 204, 211–216, 234, 237–238, 305, 619

(56) References Cited

U.S. PATENT DOCUMENTS 4,692,877 A    9/1987  Byerly et al. ............... 364/514
5,631,762 A  * 5/1997  Kataoka ..................... 359/204
5,923,359 A  * 7/1999  Montgomery ............... 347/255

FOREIGN PATENT DOCUMENTS

| JP | 56-110960 | 9/1981 | .......... G03G/15/04 |
| JP | 63-217763 | 9/1988 | ............ H04N/1/04 |
| JP | 02-105110 | 4/1990 | ........... G02B/26/10 |
| WO | WO9409989 | 5/1994 | ............ B41J/2/435 |

* cited by examiner

Primary Examiner—Lamson Nguyen
(74) Attorney, Agent, or Firm—Shirley Church

(57) ABSTRACT

A scanning system uses a multi-beam brush having a widely separated beams, a modulator that controls intensity of pixels in scan beams, an optical system that minimizes scan line bow at the expense of non-uniform scanning beam velocity, and a timing generator that generates a pixel clock signal having a variable period that compensates for the non-uniformity of pixel velocity. The wide separation of scan beams permits the modulator to turn beams on or off with a direction of brightening or darkening in the cross-section of the beams being opposite to the scanning direction. A novel arrangement of the beams in the brush permits a uniform indexing step size to uniformly expose an image region. In one embodiment, the timing generator includes: a source of pixel period values; a select circuit to select pixel period values for pixels, and a counter that loads a first value from the pixel period value selected for a pixel, counts for a period of time indicated by the first value, and asserts a signal marking an end of the period. An additional delay after the signal from the counter can be shorter than the period of a clock signal to the counter but also controlled by the pixel period value.

13 Claims, 6 Drawing Sheets

SCANNING BRUSH AND METHOD OF USE

CROSS REFERENCE TO RELATED APPLICATION

This application is a divisional application of application Ser. No. 09/273,115, filed Mar. 19, 1999, now U.S. Pat. No. 6,731,320.

This patent document is related to and incorporates by reference in its entirety, co-filed U.S. patent application Ser. No. 09/272,947, entitled "Multi-Beam Scanner Including A Dove Prism Array".

BACKGROUND

1. Field of the Invention

This invention relates to printing systems and methods and particularly systems and methods using multiple scan beams that have wide lateral separations.

2. Description of Related Art

Printing systems including scanners are suitable for a variety of applications including printing text on paper, patterning photoresist during integrated circuit manufacture, and creating masks or reticles for projection-type photolithography systems. For integrated circuit applications, the printing systems typically require submicron precision. FIG. 1A illustrates the basic architecture of a precision printing systems 100 that employs scanning. System 100 includes: a light source 110 such as a laser; an acousto-optic modulator 120 that controls intensity of one or more input beams 135; pre-scan optics 130 that control the position, shape, and collimation of input beams 135; a scanning element 140 such as a polygon mirror that sweeps scan beams 145 along a scan direction; and post-scan optics 150 that focus scan beams 145 on an image plane 160. Scanning of scan beams 145 forms scan lines that expose a pattern in an image area of plane 160. Acousto-optic modulator 120 modulates the intensity of input beams 135 to select the pattern that scan beams 145 expose.

A conventional acousto-optic modulator includes a block of material such as fused silica through which input beams propagate. To turn on, turn off, or change the intensity of an input beam, a transducer generates an acoustic wave that crosses the path of the input beam in the block. The acoustic wave locally changes the optical properties of the block and deflects part of the input beam. Typically, a beam stop later in the optical train blocks the undeflected portion of the beam.

A concern for a precision scanner having a conventional acousto-optic modulator is the orientation of the scanning direction relative to propagation of the acoustic waves that modulate the input beams. If the propagation direction and the scanning direction are not collinear, the turning on and turning off of beams can reduce sharpness of edges or create undesired skew or directional bias in a pattern being illuminated. FIG. 1B illustrates an illuminated region 170 of a scan line formed when an acoustic wave deflects an input beam in a direction 178 that (after convolution through the system optics 130 and 150) is perpendicular to a scan direction 172. Deflection direction 178 typically corresponds to the direction of propagation of the acoustic wave in the acousto-optic modulator. As acousto-optic modulator 120 turns on input beam 135, a cross-section 174 of the beam expands in direction 178. Accordingly, the initially illuminated part of region 170 is narrow and toward one edge until the input beam has a fully illuminated cross-section such as cross-section 175. Similarly, when acousto-optic modulator 120 turns off input beam 135, one edge of the input beam darkens first, and a shrinking cross-section 176 of the beam causes illuminated region 170 to recede toward the opposite edge.

This reduces sharpness at the edges of illuminated regions formed by multiple scan lines, skews rectangular illuminated areas, and causes pattern lines at 45° to the scan direction to differ in thickness from pattern lines at 135° to the scan direction.

However, to provide independent control of the beam intensities and a narrow scan brush, acoustic waves in an acousto-optic modulator generally propagate at an angle relative to the scan direction.

As shown in FIG. 1C, a separation 133 between beams 132, 134, 136, and 138 inside acousto-optic modulator 120 must be sufficient for acoustic waves 122, 124, 126, and 128 to independently modulate respective beams 132, 134, 136, and 138. Typically, separation 133 must be more than a beam diameter. To avoid the separation causing gaps between scan lines, a scanning direction 172 is selected so that beams 132, 134, 136, and 138 overlap when viewed along the scan direction 172. An advantage of overlapping beams is the narrow width 180 of the scan brush. Narrow brushes reduce scan line bow which is common for conventional f-θ scan lenses. (Scan line bow is the curvature of scan lines that are off the optical axis of a scan lens.) Also, scanning overlapping beams along scan direction 172 forms a band of scan lines without intervening gaps, which simplifies indexing of scan lines to cover the image area. As indicated above, disadvantages of the configuration of FIG. 1C are reduced sharpness at the edges in the image, skew of rectangular areas, and 45°/135° line thickness bias.

As shown in FIG. 1D, the scan direction 172 can alternatively be the same as or opposite to the direction of propagation of acoustic waves 122, 124, 126, and 128 in acousto-optic modulator 120. With this configuration, the separation 133 required for independent modulation of beams controls the separation between the scan lines. This creates a scan brush that is wider than the brush of FIG. 1C, and the wider scan brush increases scan line bow from a conventional f-θ scan lens, making the accuracy required for integrated circuit applications difficult to achieve. Other types of scan lenses can reduce scan line bow but generally cause scan beams to move with non-uniform velocity and therefore can distort the image.

Systems and methods are sought that use simultaneous scan beams for faster scanning but avoid scan line bow and image distortion and also avoid the skew, blurred edges, and directional bias associated with acousto-optic modulators having acoustic waves propagating at an angle to the scan direction.

SUMMARY

In accordance with the invention, a multi-beam scanner has a wide scan brush, a modulator that controls intensity of pixels in scan beams, an optical system that minimizes scan line bow at the expense of non-uniform scanning beam velocity, and a timing generator that generates a pixel clock signal having a variable period that compensates for the non-uniformity of pixel velocity. The wide separation of scan beams permits the modulator to turn beams on or off with a direction of brightening or darkening in the cross-section of the beams being opposite to the scanning direction. This allows the brightening direction to be opposite the scan direction to improve edge sharpness, avoid skew in rectangular regions, and avoid a directional bias in line thickness.

A novel arrangement of the beams in the brush permits a uniform indexing step size to uniformly expose an image region. In particular, a brush with b beams spaced a distance n apart uniformly covers the image region after repeated scanning and indexing by a distance m if the number of beams b and the distances n and m are such that the ratio of m to n is equal to the ratio of b to an integer q that has no common factors with b. In one embodiment, a diastemal brush has a top half including b beams uniformly spaced distance n apart and a bottom half including b beams uniformly spaced distance n apart. The distance between the top and bottom halves is 1.5*n. With this diastemal brush and a uniform indexing distance m, the top half forms uniformly spaced scan lines, and the bottom half forms scan lines midway between adjacent scan lines that the top half forms. Other embodiments of the scan bush include three or more sections of equal spaced beams separated by two or more diastema.

In one embodiment, the timing generator includes: a source of pixel period values and a counter. The counter loads a first part of a pixel period value selected for a pixel, counts for a period of time indicated by the first part, and asserts a signal marking an end of the period. An additional delay calculator circuit can delay the signal from the counter for a time shorter than the period of a clock signal to the counter. A second part of the pixel period value controls the delay. The combination of the times for the count and the delay forms the complete pixel period. After asserting a pulse for the pixel clock for a pixel period, the source supplies the next pixel period value which controls the count and delay for the next pixel period.

In alternative embodiments, the source of the pixel period values includes a set of registers, a register and a series of adders, or a look-up table. In one embodiment, the source of pixel period values includes a lookup table, a start index register, and a pixel counter, which initially loads from the start index counter and supplies an address to a lookup table. When a set of registers or a register and a series of adders provide the pixel period values, a multiplexer selects the pixel period value according to a select signal from a look-up table. The look-up table is indexed by pixel and selects an appropriate pixel period value for each pixel. The pixel counter increments the pixel index each time the timing generator marks a boundary of a pixel, and in response to the changed pixel index, the timing generator selects the next pixel period value.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the invention, a precision printing system employs a scanner and multiple scan beams arranged in a wide scan brush with separations between individual beams. An acousto-optic modulator or deflector in the printing system controls the intensities of individual scan beams using acoustic waves oriented along the scan direction. Accordingly, as the acousto-optic modulator turns a beam on or off, successive portions of a scan beam cross-section brighten or darken along the direction of propagation of the scan lines. The printing system uses a scan lens such as an f-sin θ scan lens that reduces scan line bow caused by the width of the scan brush, and a timing generator that generates a pixel clock signal with a variable period to compensate for variations in the velocity of scan beams.

Figure 1A:
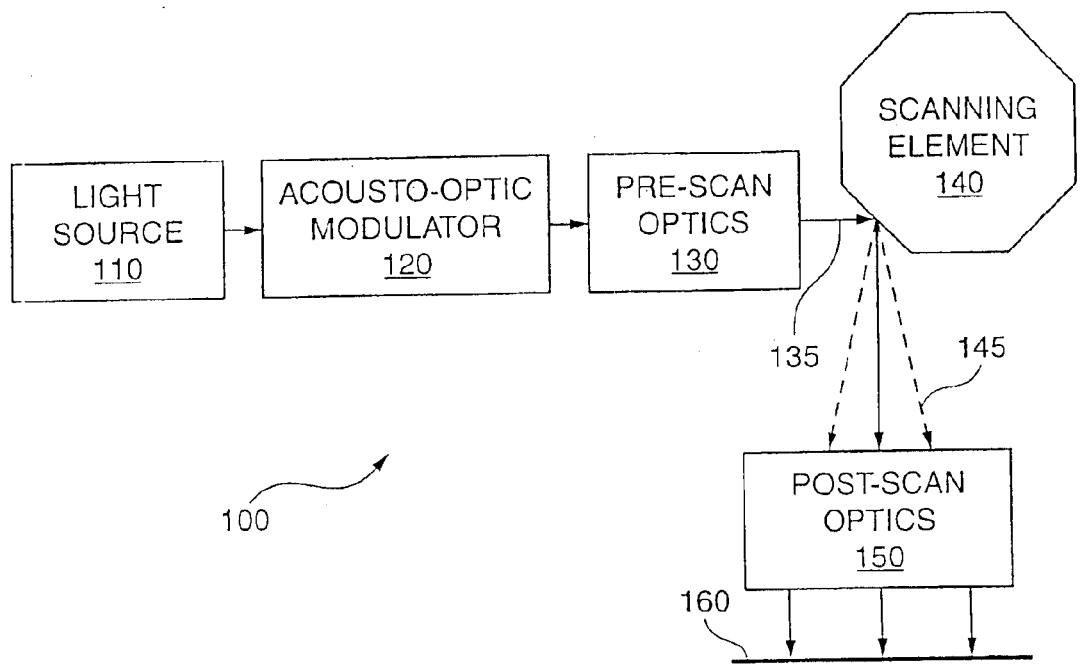
FIG. 1A shows a prior art printing system.
Figure 1B:
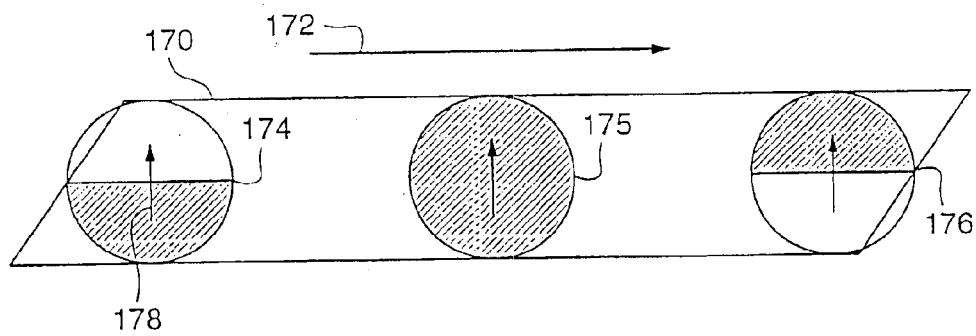
FIG. 1B illustrates the relation between the cross-section of a scan beam that is being turned on and then off and the shape of a resulting illuminated region.
Figure 1C:
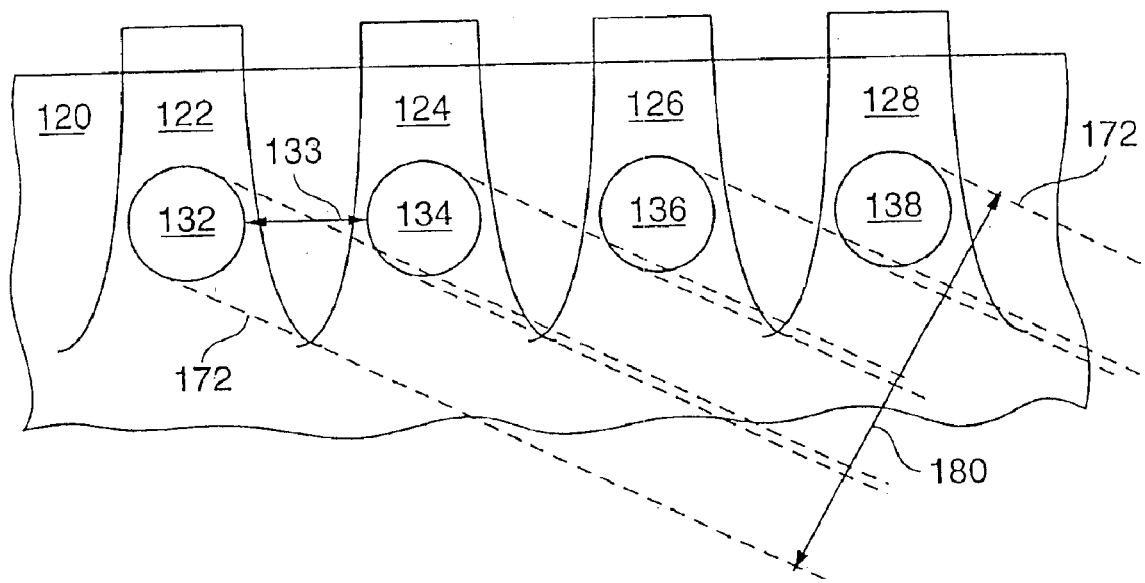
FIGS. 1C and 1D show alternative orientations of the scan direction in an acousto-optic modulator.
Figure 1D:
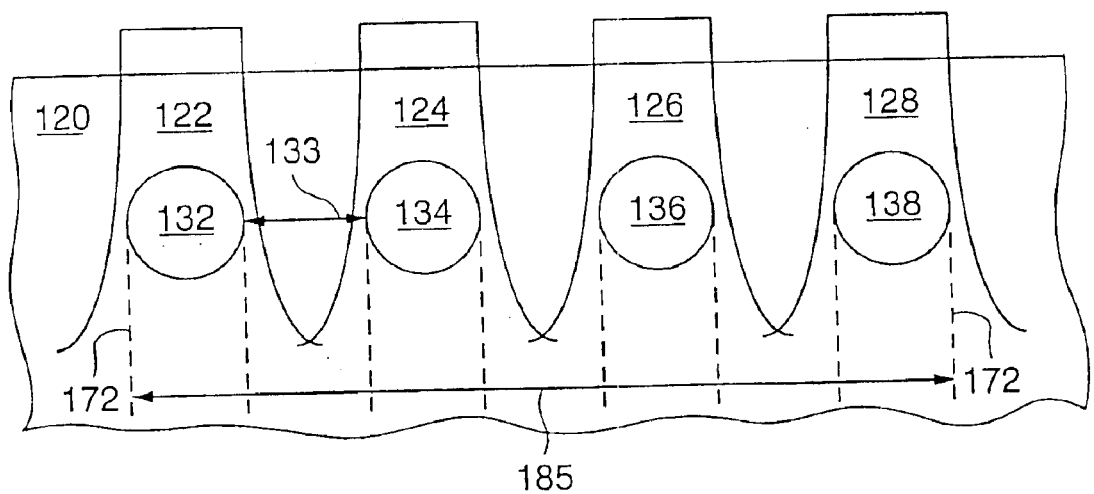
Figure 2:
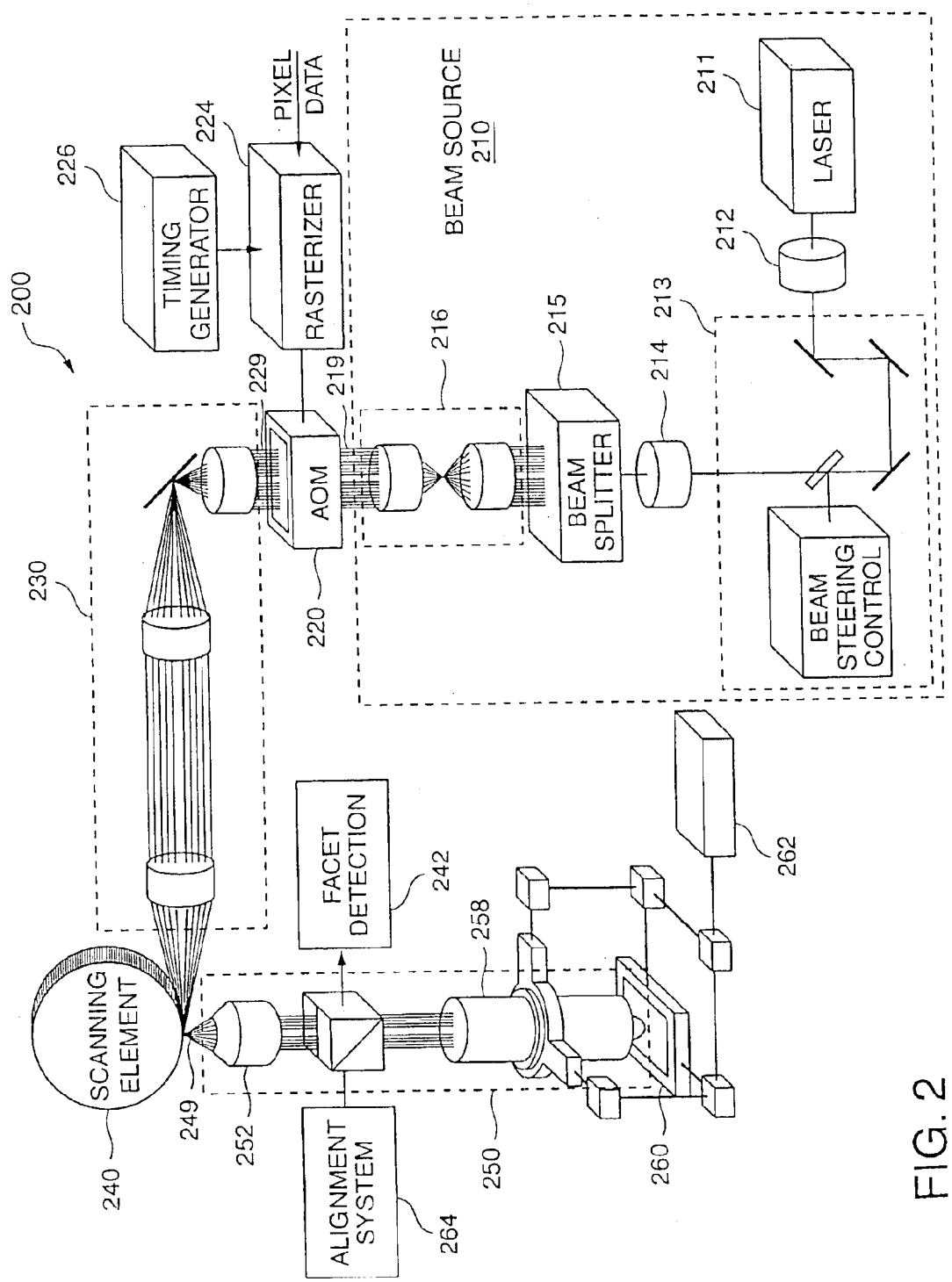
FIG. 2 is a block diagram of a precision printing system in accordance with an embodiment of the invention.

FIG. 2 shows a precision printing system 200 that employs scanning in accordance with an embodiment of the invention. A pre-scan portion of system 200 includes a beam source 210, an acousto-optic modulator (AOM) 220, and pre-scan optics 230. Beam source 210 forms multiple input beams 219 which are spaced along a line to form a brush. AOM 220 modulates the intensity of each input beam 219 independently and directs the modulated scan beams 229 to pre-scan optics 230. In accordance with an aspect of the invention, acoustic waves in AOM 220 are oriented so that each beam 229 brightens in a direction perpendicular to the line of beams 229 as AOM 220 turns on the beam 229. Pre-scan optics 230 direct the line of modulated input beams 229 onto a scanning element 240 so that the scanning direction resulting from movement of the scanning element is opposite the brightening direction of beams 229. Pre-scan optics 230 optionally includes brush rotation optics, such as a K mirror or a dove prism, that rotates the line of the brush if necessary to align the brightening and scan directions.

Scanning element 240 directs multiple scan beams 249 into post-scan optics 250. Scanning element 240 is preferably a rotating polygon mirror that during scanning rotates with a constant angular velocity. Alternatively, an oscillating mirror or a rotating holographic element could be employed. Post-scan optics 250 focuses the scan beams as the scan beams sweeps along scan lines on a surface of a workpiece. Post-scan optics 250 include a scan lens 252 and a reduction lens 258. In an exemplary embodiment of system 200, scan lens 252 is an f-sin θ lens, which reduces scan line bow for wide scan brushes. F-sin θ lens are known in the art.

U.S. Pat. No. 5,018,807 to Shirota and U.S. Pat. No. 5,235,438 to Sasada describe examples of f-sin θ lenses and are hereby incorporated by reference in their entirety. Since lens 252 is an f-sin θ lens and scanning element 240 rotates with a uniform velocity, the scan beams which form scan lines on a workpiece move with non-uniform velocity in the image plane. A timing generator 226 as described further below provides a non-uniform pixel clock signal to synchronize modulation of the scan beams with the positions of the scan beams on the workpiece.

Reduction lens 258 reduces the scan line size and separation and the resulting image size as required for the image to be formed on the workpiece. For the exemplary embodiment, the workpiece is a mask, a reticle, an unprocessed wafer, or a partially processed wafer that is coated with a layer of photoresist. A precision stage system 260 which is connected to an interferometer 262 and an alignment system 264 positions and moves the workpiece as required for alignment and indexing after each scan line. Alignment system 264 identifies the positions of alignment marks on the workpiece as viewed through reduction lens 258 and accordingly determines the position and orientation of the workpiece relative to the scan lines. Interferometer 262 monitors the movement of the workpiece for indexing.

Beam source 210 includes a light source 211, beam-shaping elements 212 and 214, a beam steering system 213, a beam splitter 215, and brush optics (or telescope) 216. Light source 211 is preferably a laser that generates a coherent beam of suitable power and wavelength for the printing performed. In the exemplary embodiment of the invention, light source 211 is a laser that produces a monochromatic beam of deep ultraviolet light having power greater than about 0.1 W. For example, a "Sabre Fred" system available from Coherent, Inc. delivers a 0.5-W beam at 244 nm or 257 nm. This deep UV laser has a resonant cavity free of oxygen and moisture to prevent formation of ozone and degradation of the BBO doubling crystal. Such lasers with appropriate components in the rest of system 200 can achieve a minimum feature size of 360 nm with a uniformity of ±20 nm and a placement accuracy of less than 20 nm at exposure doses up to 200 mJ/cm$^2$ using multiple pass printing. The environment for the optical system and workpiece is a clean environment that is kept at a temperature controlled to ±0.05° C. High purity nitrogen is a suitable purge gas where required.

Beam preparation optics 212 and beam steering system 213 direct the beam from light source 211 to beam splitter 215 which splits the beam into multiple input beams 219 for AOM 220. In the exemplary embodiment, beam splitter 215 and telescope 216 form thirty-two input beams 219 which are along a line with a 404.8-$\mu$m on center spacing. The center two beams are separated by an extra 202.4 $\mu$m for a total separation of 607.2 $\mu$m (one and one half times the normal spacing). The separations between input beams 219 are sufficient for AOM 220 to modulate the intensity of each beam independently.

AOM 220 is a block of material such as fused silica having a patterned layer of lithium niobate bonded to one surface. Electric signals applied to contacts lithographically defined in a conducting layer overlying the lithium niobate layer create multiple acoustic waves. Each acoustic wave propagates through the path of an associated input beam in the block, deflects the associated input beam, and controls the intensity reaching an aperture that selects the diffracted beam. A rasterizer 224 generates the signals that create the acoustic waves and as a result controls the intensity of modulated beams 229. In particular, rasterizer 224 divides each scan line into pixels and generates the signals as required for each pixel to have a desired intensity. For timing, a facet detection system 242 detects the orientation of scanning element 240 to identify the beginning of scan lines, and a timing generator 226 generates pixel clock signals to identify the beginning of each pixel in a scan line. In a system where scan beams scan at a uniform rate, the pixel clock signal is a uniform periodic signal. In the exemplary embodiment, the pixel clock signals have periods that vary according to variations in the scan rates for associated scan lines. Timing generators suitable for non-uniform scan rates are described below.

To provide the maximum space for separate acoustic waves that control individual beam intensities, the acoustic waves propagate along a direction perpendicular to the line of input beams 229. The direction of propagation of the acoustic waves is the same as the direction in which successive portions of a beam 229 become illuminated as AOM 220 turns on the beam. This direction is sometimes referred to herein as the brightening direction. In accordance with an aspect of the invention, the brightening direction for the scan beams at the image plane of system 200 is opposite the scan direction. This prevents the blur, skew, and line thickness bias described above, but also leaves a separation between the scan beam along the direction perpendicular to the scan direction. The scan beams thus form a "brush" for simultaneous illumination of multiple scan lines that are separated from each other.

Figure 3:
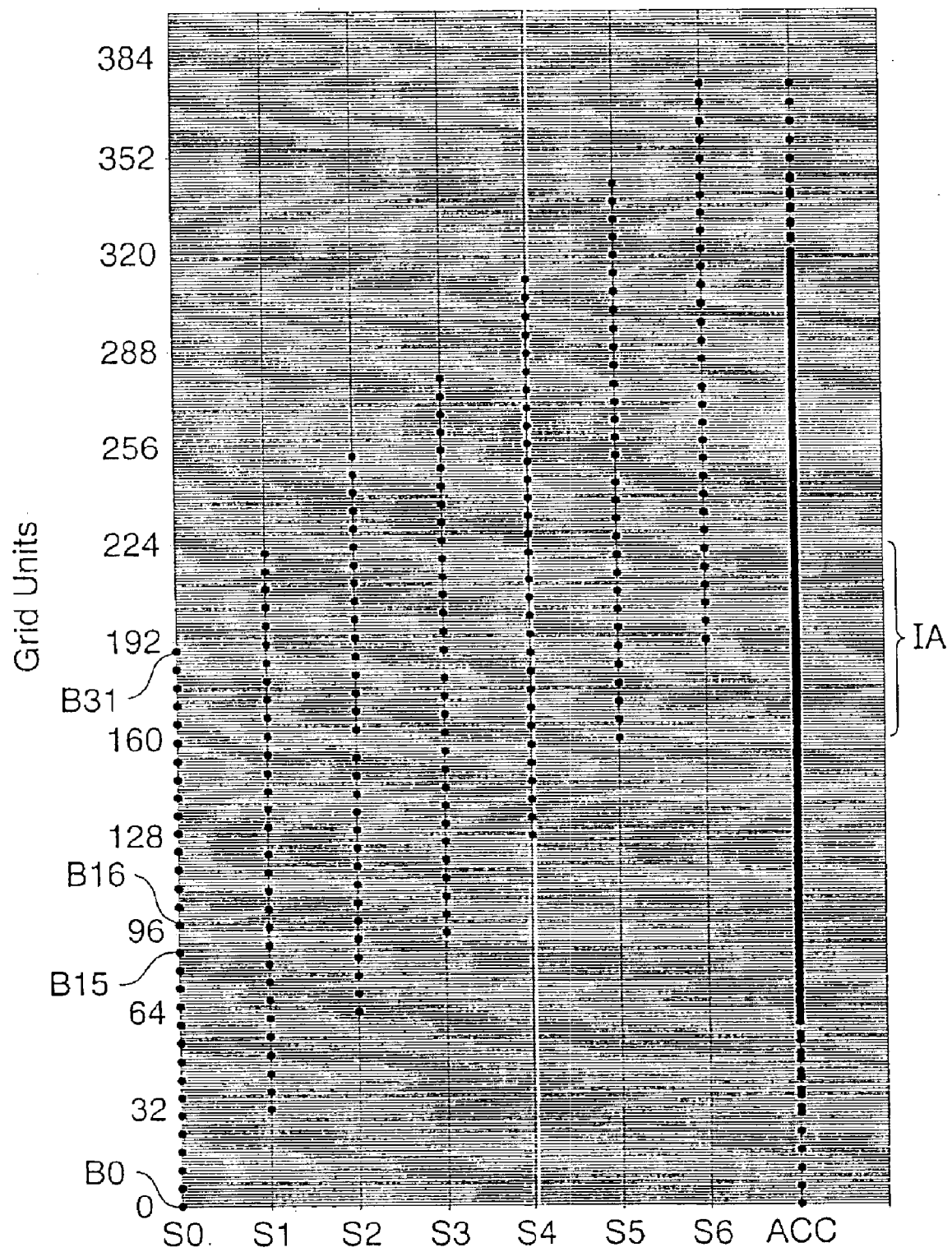
FIG. 3 illustrates an interleaved scanning process in accordance with an embodiment of the invention.

FIG. 3 illustrates an exemplary brush configuration, the relative positions of the scan beams during seven scans S0 to S6, and the accumulated exposure for scans S0 to S6. The exemplary brush configuration includes 32 beams B0 to B31. In FIG. 3, the size of beams B0 to B31 and the spacings between beams B0 to B31 are indicated in arbitrary "grid units." For example, each of scan beams B0 to B31 has a radius of about 2 grid units, and the center-to-center separation between adjacent beams is 6 grid units (except for the central beams B15 and B16 which are separated by 9 grid units.) The actual separations and sizes of beams change according to the optical properties of system 200. At AOM 220, the separations for beams B0 to B32 (i.e., beams 219) are 404.8 $\mu$m or 607.2 $\mu$m, but the demagnification between AOM 220 and the image plane of system 200 is about 1/400 so that the separations at the image plane are on the order of 1 $\mu$m.

Interleaved scanning of the scan brush of FIG. 3 covers the image area. With the exemplary brush, which has a 50% wider separation between central beams B15 and B16, a constant displacement for indexing after each scan interleaves the scan beam for uniform coverage of an image area IA. For example, indexing in FIG. 3 displaces the scan brush by 32 grid units relative to the object being scanned. In system 200, indexing occurs when precision stage 260 moves the object being scanned perpendicular to the scan line direction. The distance that stage 260 moves the object is equivalent to 32 grid units in the image plane. After scans S0 to S6, an accumulated exposure ACC in image area IA includes scan lines with a uniform center-to-center separation of one grid unit. The one grid unit center-to-center spacing overlaps the scan lines for smoother imaging. Adding additional scans after scan S6 will expand the area of uniform exposure IA.

The interlaced scanning illustrated in FIG. 3 can be generalized. Specifically, if a brush containing b uniformly spaced beams having centers separated by n units is repeatedly scanned with an increment of m units between each scan, uniform coverage (i.e., evenly spaced scan lines) will be achieved if the scan parameters satisfy Equation 1.

Equation 1:

$$\frac{m}{n} = \frac{b}{q}$$

In Equation 1, the parameter q is an integer having no common factors with the number of beams b. The interleaved scanning can also be employed with diastemal brushes such as illustrated in FIG. 3. In particular, a beam having two uniformly spaced halves that independently satisfy Equation 1 and a diastema of 1.5 times m between the halves will write uniformly spaced scan lines with the top half forming scan lines exactly between the scan lines that the bottom half forms. For the scanning illustrated in FIG. 3, the number of beams b per half is 16. The number of units n between beams is 6. The number of scans NS required for uniform coverage is 6, and the offset m between scans is 32. As a result of the scan in the desired coverage area IA, scan lines are uniformly spaced one unit apart. The radius of the beams can then be selected to provide the desired coverage or overlap of the scan lines.

An alternative diastemal scan brush includes three or more sections of uniformly spaced beams where the separations between pairs of sections differ from the spacing of beams within a section. For example, a diastemal scan brush can include three sections containing beams uniformly space one unit apart and two diastema providing separations of one and a third units between sections can provide uniform scan coverage. Many other diastemal scan brushes having multiple diastema are possible.

Returning to FIG. 2, rasterizer 224 controls the intensity of the individual beams to form an image containing a rectangular array of uniformly sized pixels. To form a rectangular array of pixels, scan lens 252 in the preferred embodiment is an f-sin θ scan lens which forms straight scan lines even for scan beams that are significantly off axis when passing through scan lens 252. With an f-sin θ scan lens, the scan position is not linearly related to the polygon angle, and timing generator 226 varies the timing between pixels slightly across each scan line to correct for the non-linearity of scan rate along the scan lines. Additionally, the f-sin θ scan lens causes different beams to have different scan positions depending on the offset of the beam from scan plane passing through the optical axis of scan lens 252. In an exemplary embodiment, this amounts to a 13 nm lag between a central beam and an edge beam for a full half field deflection of about 12 degrees. If desired, timing generator 226 could generate separate timing signals for separate beams to compensate for different lag for each beam. However, in the exemplary embodiment timing generator 226 generates a single pixel clock signal for all the beams.

Figure 4:
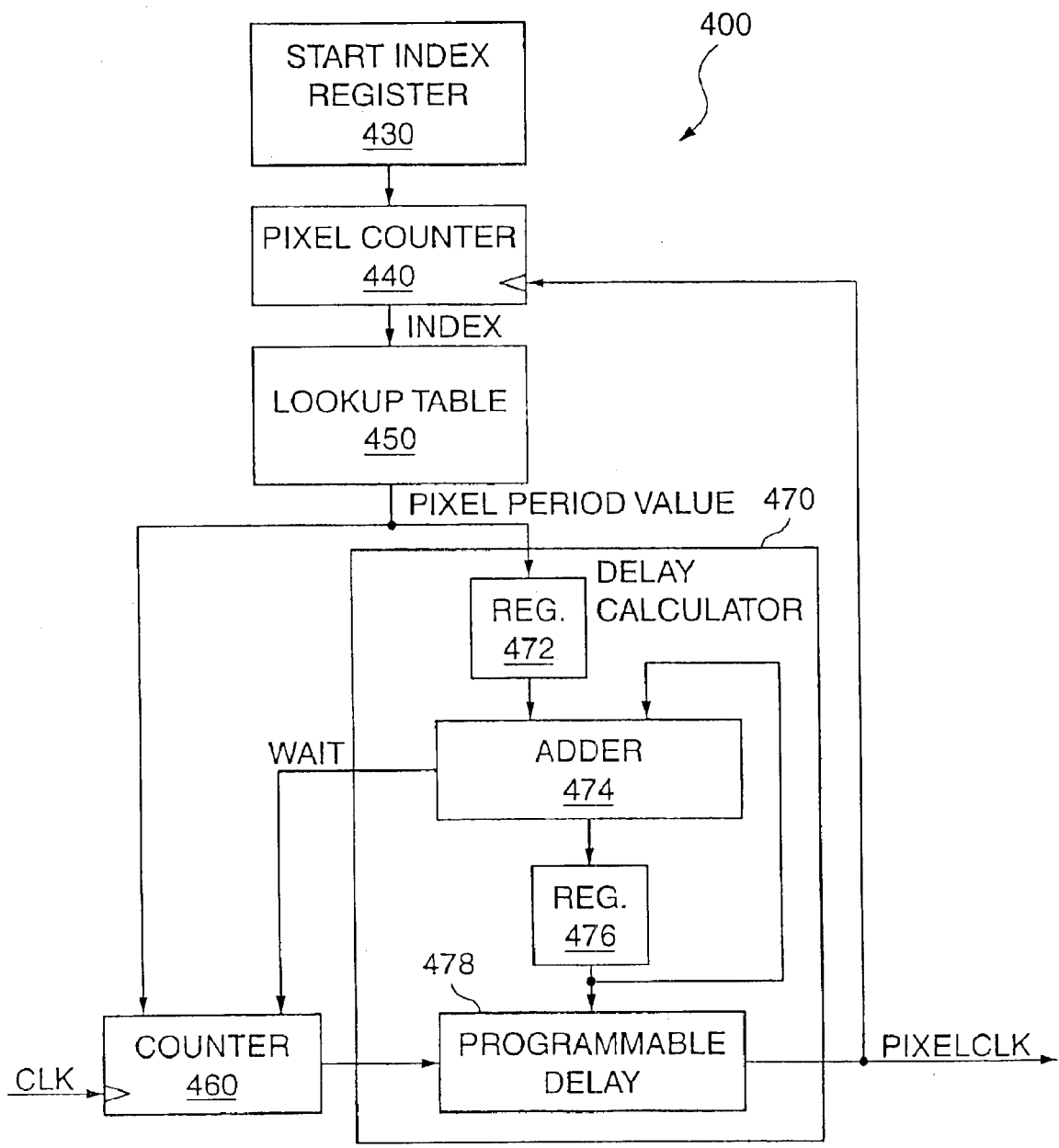
FIGS. 4, 5, and 6 are block diagrams of timing generators for a printing system such as illustrated in FIG. 2.

FIG. 4 is a block diagram of a timing generator 400 suitable for use as timing generator 226 in the system of FIG. 2. Timing generator 400 includes a start index register 430, a pixel counter 440, a lookup table 450, a counter 460, and a delay calculator 470. Start index register 430 and pixel counter 440 provide to lookup table 450 a signal INDEX corresponding to the position of a scan beam at the start of the next pixel. Lookup table 450 then supplies to counter 460 and delay calculator 470 a pixel period value that controls the period between the start of one pixel (e.g., one rising edge of a signal PIXELCLK) and the start of the next pixel (e.g., the next rising edge of signal PIXELCLK).

Pixel clock period values in lookup table 450 differ from each other to correct for systematic scan direction non-linearity in the motion of scan beams as projected by the scan optics. In particular, the table contains pixel period values representing pixel periods $T_i$ that approximately satisfy Equation 1.

Equation 1:

$$f \sin\left[\omega\left(\sum_{i=1}^{N} T_i\right)\right] = X_N$$

Where f is the focal length of the f-sin θ scan lens, ω is a constant angular frequency for the scanning, and $X_N$ is the position of the pixel corresponding to index value N. Pixel period values are symmetric about the zero index which corresponds to an angle of zero degrees.

In the exemplary embodiment, lookup table 450 contains pixel period values for more pixels than are required for a scan line. This allows correction for position errors that precision stage 260 introduces in the scan direction. In particular, the angle of the scan beam at start of a scan line on a workpiece depends on the position of the workpiece, and the correct pixel periods are selected according to the angular positions of the pixels. After determining the error in stage position for a scan line, start index register 430 is loaded with the index corresponding to the pixel period value for the first pixel position in the exposed scan line. The index value from register 430 is used to initialize pixel counter 440 for the pixel at the start of the scan line. Pixel counter 440 generates a signal INDEX that indicates an address for lookup table 450 and selects the correct pixel period value for counter 460 and delay calculator 470.

The pixel period value indicates a number of full periods of a clock signal CLK and a fraction of the period of signal CLK. In the exemplary embodiment, signal CLK has a period of 2 ns, and the pixel period values are 8-bit values including a 5-bit count of the full periods and a 3-bit value indicating the fraction. To generate the period for a pixel, counter 460 loads the pixel period value and then counts according to clock signal CLK until reaching a terminal count. Counter 460 then asserts a terminal count signal to delay calculator 470. Delay calculator 470 delays asserting pixel clock signal PIXELCLK by a fraction of the period of signal CLK. The fraction is a combination of the fraction from the pixel period value and a fractional delay used for the last assertion of signal PIXELCLK. The result of the combination has a fractional part that is the fractional delay for the current pixel. When delay calculator 470 calculates a delay greater than one period of clock signal CLK, delay calculator 470 signals counter 460 with a signal WAIT that changes the terminal count or otherwise causes counter 460 to wait one count longer than its programmed value before asserting the terminal count signal. Delay calculator 470 asserts signal PIXELCLK after receiving the terminal count signal and waiting for a fraction of the period of signal CLK. In this manner, timing generator 400 generates pixel periods with finer resolution than one period of clock signal CLK.

In the embodiment of FIG. 4, delay calculator 470 includes registers 472 and 476 for current and previous fractions, an adder 474, and a programmable delay 478. At the start of a pixel (e.g., assertion of signal PIXELCLK) registers 472 and 476 respectively register a fraction from the pixel period value and a previously determined fraction from adder 474. At the same time, counter 460 registers the number of full periods from the pixel period value and begins counting. To determine the fractional delay for a pixel period, adder 474 adds the factions from registers 472 and 476. If the resulting sum is greater than one period of signal CLK, adder 474 asserts a carry bit as signal WAIT and to delay by one clock cycle assertion of the terminal count signal from counter 460, and the fraction from adder 474 controls the amount of delay. In one specific embodiment, adder 474 has a 3-bit width so that the output signal adder 474 applies to programmable delay 478 selects one of eight delays. Since the programmable delay spans less than one 2-ns clock cycle, each delay increment is 2 ns/8 or about 0.250 ns. Alternatively, adder 474 could be of greater width than three bits to permit finer divisions of the programmable delay.

The assertion of signal PIXELCLK marks the start of a pixel and causes counter 460 and delay calculator 470 to register the current pixel period value and pixel counter 440 to increment and select the next pixel period value from lookup table 450. A scan line is complete when the number of pixel clock periods generated is equal to the number of pixels in the scan line. The process then begins again for the next scan line with an update of the value in the start index register 430 according to the positioning of the workpiece for the next scan line.

Figure 5:
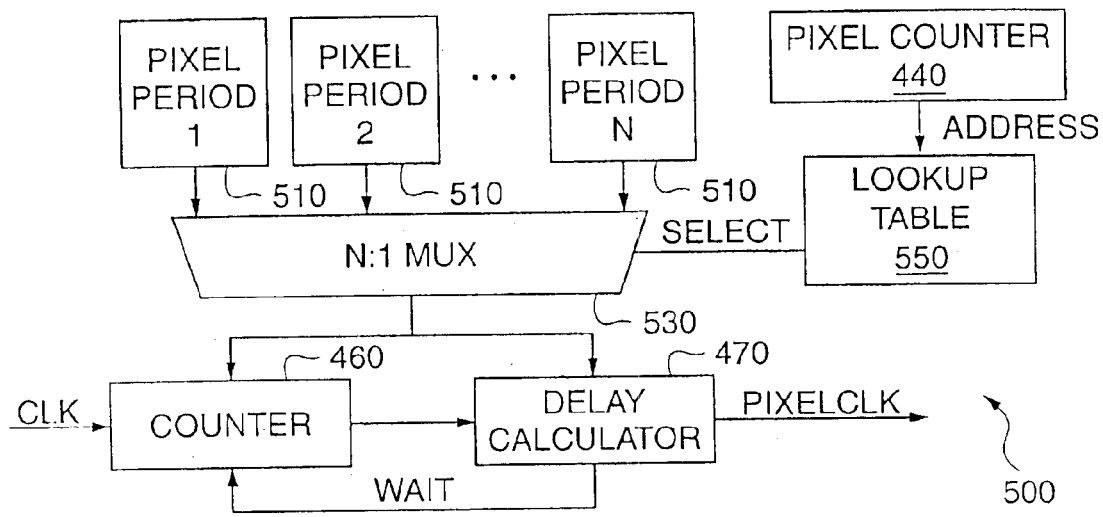
Figure 6:
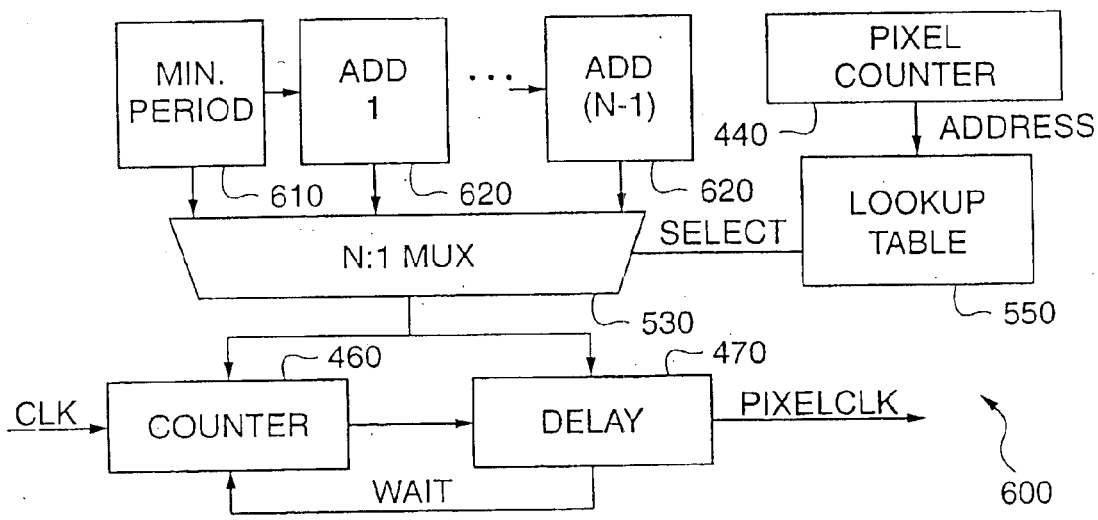

FIGS. 5 and 6 are block diagrams of alternative embodiments of timing generator 226. FIG. 5 shows a timing generator 500 which generates a pixel clock signal PIXELCLK that marks the beginnings of pixels in a scan line. For timing generator 500, the period between the start of one pixel and the start of the next pixel is one of N different times where N is 2 or more. Generator 500 includes N digital storage elements 510 (e.g., N registers or ROM cells) which store pixel period values corresponding to the different periods. Storage elements 510 are coupled to the inputs of a multiplexer 530 which has a select terminal coupled to a lookup table 550. Lookup table 550 contains i-bit selection values, where i is an integer such that $2^i$ is equal to or greater than N. The selection values correspond with pixels, and each selection value identifies which of the N pixel period values corresponds to the period for a corresponding pixel.

As described above, pixel counter 440 is initialized according to a positioning error for the workpiece before the start of each scan line and increments a pixel count each time signal PIXELCLK is asserted. The pixel count from counter 440 provides an address signal for lookup table 550. Lookup table 550 outputs to multiplexer 530 a select value corresponding to the pixel count. In response to the select value, multiplexer 530 selects one of the pixel period values from storage elements 510, and applies one or more most significant bits of the selected period value to counter 460 and one or more of the least significant bits of the pixel period value to delay calculator 470. When signal PIXELCLK is asserted to mark the start of a pixel, counter 460 loads a portion of the pixel period value from multiplexer 530 and begins incrementing the loaded value at a rate determined by clock signal CLK. When the count reaches the terminal count, counter 460 asserts the terminal count signal to delay calculator 470. Delay calculator 470 asserts signal PIXEL-CLK after a delay that is a fraction of the period of clock signal CLK, the fraction being determined by the delay for the previous pixel and the least significant bits of the current pixel period value.

FIG. 6 is a block diagram of a timing generator 600 in which a storage element 610 and a set of adders 620 provide the period values to multiplexer 530. In particular, storage element 610 stores a count representing the minimum period between the beginnings of consecutive pixels. Adders 620 add offsets to the minimum period to generate pixel period values associated with the various pixels. Multiplexer 530 selects a pixel period value from one of storage element 610 and adders 620 and applies the selected pixel period value to counter 460 and delay 470. Timing generator 600 otherwise operates in the same manner as timing generator 500 of FIG. 5.

Since each scan line scans at a slightly different rate from its neighbors, timing generator 226 can include multiple timing circuits such as generators 400, 500, and 600. Each such timing circuit provides a pixel clock signal for one or more scan lines. The exemplary embodiment of the invention uses one timing circuit and a single pixel clock signal for all of the scan lines being simultaneously formed.

Although the invention has been described with reference to particular embodiments, the description only provides examples of the applications of the invention and should not be taken as a limitation. For example, timing circuit 600 of FIG. 6 adders 620 add offsets to a minimum pixel period value to generate the range of pixel period values, but alternatively the range of pixel values can be generated from the minimum, the maximum, or an intermediate pixel period count using a variety of arithmetic or logic circuits. Various other adaptations and combinations of features of the embodiments disclosed are within the scope of the invention as defined by the following claims.

We claim:

1. A scanning system comprising:
    a source of a scan brush including a first plurality of beams that in a single sweep forms a number b of scan lines that are uniformly spaced apart by a distance n;
    scan optics that sweep the scan brush along a scanning direction of scan lines in an image plane; and
    an indexing system that move an object relative to the scan brush by a distance m, wherein the distance m, the distance n, and the number b satisfy $$\frac{m}{n} = \frac{b}{q},$$

q being an integer having no factors in common with b.

2. The scanning system of claim 1, further comprising a modulator positioned to separately control intensities of the first plurality of beams, wherein the modulator causes each beam to have a brightening direction that is opposite to the scanning direction.

3. The scanning system of claim 1, wherein the distance m is perpendicular to the scanning direction.

4. The scanning system of claim 1, wherein the scan brush from the source further comprises a second plurality of beams that in a single sweep forms scan lines that are uniformly spaced apart by the distance n, wherein the scan lines that the second plurality of beams form in the sweep are separated from the scan lines that the first plurality of beams form in the sweep by a separation that differs from the distance n.

5. A method for printing comprising:
    forming a scan brush including a first plurality of beams that in a single sweep forms a number b of scan lines that are uniformly spaced apart by a distance n;
    scanning the scan brush along an object to expose a set of scan lines on the object;
    moving the object relative to the scan brush by a distance m, wherein the distance m, the distance n, and the number b satisfy $$\frac{m}{n} = \frac{b}{q},$$

q being an integer have no factors in common with b; and
    repeating the scanning and moving a number of scans required for uniform coverage to expose uniformly spaced scan lines on a region on the object, the uniformly spaced scan lines in the region being spaced apart by a distance less than the distance n.

6. The method of claim 5, wherein forming the scan brush further includes forming a second plurality of beams that in a single sweep forms scan lines that are uniformly spaced apart by the distance n, the scan lines formed by the second plurality of beams in the sweep being separated from the scan lines formed in the sweep, by the first plurality of beams by a separation that differs from the distance n.

7. The method of claim 6, wherein the separation is 1.5 times the distance n.

8. The method of claim 6, wherein the uniformly spaced scan lines in the region include scan lines formed by the first plurality of beams and scan lines formed by the second plurality of beams.

9. The method of claim 5, further comprising employing f-sin(θ) lens in scan optics that form the scan lines on the object.

10. The method of claim 5, further comprising independently modulating the intensity of each beam to control exposure of uniformly sized pixels that make up the scan lines.

11. The method of claim 10, further comprising:
    rotating a scanning element at a uniform angular velocity to sweep the scan brush across the object; and
    generating a pixel clock signal that identifies boundaries of the pixels, wherein periods of the pixel clock signal are non-uniform and compensate for non-uniform velocity of the beams at the object.

12. The method of claim 11, further comprising employing f-sin(θ) lens in scan optics that form the scan lines on the object.

13. The method of claim 5, wherein each of the uniformly spaced scan lines in the region have a thickness that such that each scan line overlaps neighboring scan lines.

* * * * *